United States Patent
Xiao et al.

(10) Patent No.: US 9,779,964 B2
(45) Date of Patent: Oct. 3, 2017

(54) THERMAL PROCESSING METHOD FOR WAFER

(71) Applicant: ZING SEMICONDUCTOR CORPORATION, Shanghai (CN)

(72) Inventors: Deyuan Xiao, Shanghai (CN); Richard R. Chang, Shanghai (CN)

(73) Assignee: ZING SEMICONDUCTOR CORPORATION, Shanghai (CN)

(*) Notice: Subject to any disclaimer, the term of this patent is extended or adjusted under 35 U.S.C. 154(b) by 20 days.

(21) Appl. No.: 15/198,706

(22) Filed: Jun. 30, 2016

(65) Prior Publication Data
US 2017/0256419 A1  Sep. 7, 2017

(30) Foreign Application Priority Data
Mar. 3, 2016 (CN) .......................... 2016 1 0120844

(51) Int. Cl.
*H01L 21/322* (2006.01)

(52) U.S. Cl.
CPC ................ *H01L 21/3225* (2013.01)

(58) Field of Classification Search
USPC ....................................................... 438/477
See application file for complete search history.

(56) References Cited

U.S. PATENT DOCUMENTS

| | | | | |
|---|---|---|---|---|
| 2002/0197823 A1* | 12/2002 | Yoo | ................... | H01L 21/76232 438/424 |
| 2003/0124873 A1* | 7/2003 | Xing | ..................... | C23C 16/402 438/770 |
| 2005/0054124 A1* | 3/2005 | Mun | ..................... | H01L 21/324 438/12 |
| 2012/0001301 A1* | 1/2012 | Ebara | ..................... | C30B 29/06 257/617 |
| 2012/0241912 A1* | 9/2012 | Senda | ................. | H01L 21/0201 257/617 |
| 2014/0158674 A1* | 6/2014 | Moffatt | ............. | B23K 26/0081 219/385 |

FOREIGN PATENT DOCUMENTS

| | | |
|---|---|---|
| CN | 101385131 A | 3/2009 |
| JP | 2003007711 A | 1/2003 |

* cited by examiner

*Primary Examiner* — Zandra Smith
*Assistant Examiner* — Lawrence Tynes, Jr.
(74) *Attorney, Agent, or Firm* — Huffman Law Group, PC

(57) ABSTRACT

The present invention relates to a thermal processing method for wafer. A wafer is placed in an environment filled with a gas mixture comprising oxygen gas and deuterium gas, and a rapid thermal processing process is performed on a surface of the wafer. As a result, a denuded zone is formed on the surface of the wafer, deuterium atoms, which may be released to improve characteristics at an interface of semiconductor devices in a later fabrication process, are held in the wafer, and bulk micro-defects are formed far from the semiconductor devices.

11 Claims, 1 Drawing Sheet

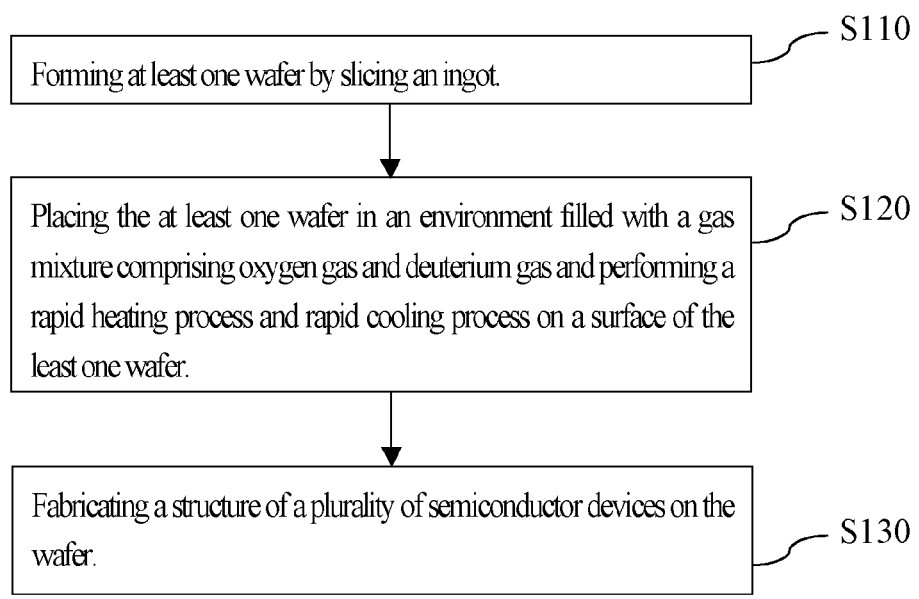

THERMAL PROCESSING METHOD FOR WAFER

FIELD OF THE INVENTION

The present invention relates to a field of wafer fabrication, and especially a thermal processing method for wafer.

BACKGROUND OF THE INVENTION

Cylindrical monocrystalline silicon ingots, grown through Czochralski (CZ) method, floating zone (FZ) method, etc., are served as basic materials for manufacturing semiconductor devices. Taking the CZ method for example, silica is heated to be melted in a crucible, and a rod-like seed crystal, about 10 mm in diameter, is then soaked in the melted silica. When the seed crystal is rotated and lifted gradually, the single crystal is grown with continued lattices constructed by silicon atoms from the melted polysilicon. If the environment is stable, the crystallization is carried out stably, and then eventually, a monocrystalline silicon ingot, cylindrical single crystal silicon, is formed. The ingot is then sliced, grinded, etched, cleaned and polished to form wafers.

Various kinds of defects may be formed during the growth of the monocrystalline silicon ingot, wafer and device fabrication due to imperfection of the monocrystalline, stress generated in the process or from the physical structure, or impurities coming from the environment, etc. For example, point defects in the form of vacancy and self interstitialcy, oxygen impurities from the quartz crucible, dislocations generated by stress or sheer force in semiconductor device fabrication, metal impurities introduced in the fabrication process and so on, may occur. Because the silicon atoms near the defects and interstitial silicon atoms own non-binding electron, and this causes interfaces or surfaces in the semiconductor devices dangling bonds. Number of carriers may be decreased by recombination or increased by generation here, depending on the bias voltage. Then, the electron mobility may be lowered to reduce the performance of the semiconductor devices. Similarly, metal impurities cause the semiconductor devices problems on the electrical characteristics, such as lower breakdown voltage, more leakage current, etc.

Another problem is hot carrier effect due to carrier injection. Carriers may get enough energy in high electric field, which relates to the small size of the semiconductor device, and then bombardments of the carriers may occur to allow a small portion of carriers entering the gate oxide. This may cause the semiconductor device low performance and unqualified reliability.

One of common solutions to solve these problems is hydrogen passivation treatment, in which the wafer formed with semiconductor devices is annealed in a hydrogen-rich environment to bind the dangling bonds with hydrogens. Through the hydrogen passivation treatment, the number of the dangling bonds as well as the undesirable effects on the operation of the semiconductor devices may be reduced. Another solution is deuterium conditioning, as disclosed in U.S. Pat. No. 5,872,387. After the fabrication of the semiconductor devices is finished, the semiconductor devices are then conditioned by deuterium gas. The deuterium atoms bind with Group III, IV or V elements in covalent bonds to form a stable structure. Thus, depassivation may be retarded, hot carriers may be reduced, leakage current may be decreased, and the performance and reliability of the semiconductor devices may be promoted. However, various kinds of dopants in the semiconductor devices may react with active hydrogen air or deuterium air at high temperature. This raises the difficulty to optimize the process parameters for passivation treatment or deuterium conditioning.

Yet, another choice is to generate oxygen precipitations in the wafers from residual interstitial oxygen atoms in a heating process. The oxygen precipitation may provide functions as a resource of intrinsic gettering for trapping metal impurities, avoiding dislocations from slipping, and promoting mechanical strength and performance of the semiconductor devices. However, if the oxygen precipitations occur in an active region of the semiconductor devices, the integrity of the gate oxide will be ruined, and this leads to leakage current which does not meet the requirement of modern semiconductor devices. Accordingly, the oxygen precipitations are necessarily formed outside the active region, such as bulk region, to avoid from hindering the operation of the semiconductor devices. To control the depth, density and size of the oxygen precipitations in a wafer is an important topic in this field.

SUMMARY OF THE INVENTION

An object of the present invention is to provide a thermal processing method for wafer, through placing a wafer in an environment filled with a gas mixture comprising oxygen gas and deuterium gas, performing a rapid thermal process on a surface of the wafer, grown-in defects may be reduced, agglomerated intrinsic point defect may be hindered, and a denuded zone (DZ) on the surface of the wafer may be formed.

Another object of the present invention is to provide a thermal processing method for wafer, through placing a wafer in an environment filled with a gas mixture comprising oxygen gas and deuterium gas, performing a rapid thermal process on a surface of the wafer, bulk micro-defects may be generated closely to the place predetermined to form a semiconductor device but not in an active region, slip of dislocations may be suppressed, and intrinsic gettering for trapping metal impurities may be promoted.

Yet, another object of the present invention is to provide a thermal processing method for wafer, through placing a wafer in an environment filled with a gas mixture comprising oxygen gas and deuterium gas, performing a rapid thermal process on a surface of the wafer, a part of deuterium atoms may exist in the wafer as interstitial impurities to bind with dangling bonds at an interface in a fabrication process for a semiconductor device to form a stable structure which is capable to promote the performance of the semiconductor device.

The other object of the present invention is to provide a thermal processing method for wafer, through placing a wafer in an environment filled with a gas mixture comprising oxygen gas and deuterium gas, performing a rapid thermal process on a surface of the wafer, depassivation may be smoothed to ensure the performance of the semiconductor devices, strengthen the resistance of the semiconductor against the hot carriers, reduce the leakage current, and raise the reliability of semiconductor devices.

The present invention provides a thermal processing method for wafer, comprising steps of placing at least one wafer in an environment filled with a gas mixture comprising oxygen gas and deuterium gas, and performing a rapid thermal process on a surface of the least one wafer.

Preferably, the step of placing at least one wafer in an environment filled with a gas mixture comprising oxygen gas and deuterium gas, and performing a rapid thermal process on a surface of the least one wafer was performed after forming the at least one wafer by slicing an ingot and before fabricating a structure of a plurality of semiconductor devices on the at least one wafer. As such, when performing this step, a complicated situation mixed by various kinds of materials or structures in the semiconductor devices and their responses or changes, which may be in an adverse way, toward this step for consideration may be avoided. This simplifies the process to optimize the step.

Additionally, in the thermal processing method for wafer, for example, the gas mixture may optionally further comprise other kind(s) of gas, such as argon gas and nitrogen gas. Each kind of gas in the gas mixture may be of variable proportion to adapt to requirements or characteristics of the wafer and/or semiconductor devices. In an example, the gas partial pressure of the oxygen gas in the gas mixture may fall within 1% to 99%, the gas partial pressure of the deuterium gas in the gas mixture may fall within 1% to 99%, the gas partial pressure of the argon gas in the gas mixture may fall within 1% to 99%, and the gas partial pressure of the nitrogen gas in the gas mixture may fall within 1% to 99%.

Further, in the thermal processing method for wafer, the rapid thermal process may be performed with various kinds of apparatuses. The order and number of rapid heating process and rapid cooling process in the rapid thermal process performed in the method, the number to transit from rapid heating process to rapid cooling process or from rapid cooling process to rapid heating process, the initial temperature to start the rapid heating/cooling process, a predetermined high temperature to achieve, and temperature gradient are all optional. Preferably, the rapid thermal process comprises a rapid heating process and a rapid cooling process. More preferably, in the rapid thermal process, the wafer is heated in the rapid heating process to the predetermined high temperature which may fall within 1200° C. to 1400° C., and then cooled in the rapid cooling process with a temperature gradient which may fall within 50° C./sec to 150° C./sec.

After performing the thermal processing method for wafer according to the present invention, preferably, a concentration of a nitrogen solid solution in the at least one wafer may fall within $1\times10^{12}$ atom/cm$^3$ to $8\times10^{18}$ atom/cm$^3$, a concentration of a deuterium solid solution in the at least one wafer may fall within $1\times10^{12}$ atom/cm$^3$ to $8\times10^{18}$ atom/cm$^3$, a denuded zone may be formed at a depth of 3 μm to 30 μm from a surface of the wafer, and a plurality of bulk micro-defects may be formed in a bulk zone which is under the denuded zone.

Therefore, wafers processed by the thermal processing method for wafer according to the present invention, preferably, have less point defects but have a denuded zone on a surface, and get deuterium atoms which may be released to improve characteristics at an interface of the semiconductor devices in a later process, control the position of the bulk micro-defects away from the semiconductor devices, improve resistance against hot carriers, reduce leakage current, smooth depassivation, and improve performance and reliability of the semiconductor devices.

BRIEF DESCRIPTION OF THE DRAWINGS

Various objects and advantages of the present invention will be more readily understood from the following detailed description when read in conjunction with the appended drawing, in which:

FIG. 1 shows a flow chart of the thermal processing method for wafer according to an embodiment of the invention.

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure.

Please refer to FIG. 1, which shows a flow chart of the thermal processing method for wafer according to an embodiment of the invention. In step S110, a wafer is form by slicing an ingot. Here, the wafer may be optionally formed with several specific processes, such as slicing, grinding, etching, cleaning, surface profiling and polishing, a series of wafer fabrication processes, to turn an ingot into wafers. Then, in step S120, the wafer is placed in an environment filled with a gas mixture comprising oxygen air and deuterium air, and a rapid thermal process is then performed on a surface of the wafer. Then, in step S130, a structure of a plurality of semiconductor devices is fabricated on the wafer, such as a gate oxide layer, dielectric layer, etc. Therefore, when performing the step S120, optionally, none of the structure of the semiconductor devices is fabricated completely or even at the initial stage on the wafer, and this prevents variable kinds of elements and structure from influence of these steps and complexity of controlling process parameters.

The surface for performing the step S120 may be one single surface or both active surface and back surface of the wafer. Taking the former for example, the surface may be chosen from the active surface or back surface, but here the active surface. Further, in the present example embodiment, the wafer is a monocrystalline silicon wafer for example. In light of the orientation of the lattices of the monocrystalline silicon wafer, the surface for performing the step S120 may be a surface along with a specific lattice direction, such as the surface of [100] direction, [110] direction or the like.

When applying the step S120, for example, the environment filled with the gas mixture comprising oxygen gas and deuterium gas may be implemented by a chamber, furnace or the like capable to introduce the gas mixture and installed with a heating apparatus and/or cooling apparatus. The heating apparatus and cooling apparatus may be implemented by an apparatus comprising a halogen lamp and a water circulating system, which is capable to perform a rapid thermal processing for one single wafer, but the present invention is not limited to this specific example.

The gas mixture may optionally further comprise other kind(s) of gas, such as argon gas and nitrogen gas, i.e. the gas mixture may comprise oxygen gas, argon gas and nitrogen gas. Due to the rapid processing duration and high thermal efficiency, inert gas, such as argon gas, and gas with low activity, such as nitrogen gas, adding into the gas mixture may moderate the activity of the gas mixture. The composition and ratio of each kind of gas in the gas mixture may be adjusted according to required characteristics for the wafer and/or semiconductor elements. For example, the gas partial pressure of the oxygen gas in the gas mixture may fall within 1% to 99%, and preferably within 5% to 15%; the gas partial pressure of the deuterium gas in the gas mixture may fall within 1% to 99%, and preferably within 85% to 95%; the gas partial pressure of the argon gas in the gas mixture may fall within 1% to 99%, and preferably within 5% to 15%; the gas partial pressure of the nitrogen gas in the gas mixture may fall within 1% to 99%, and preferably within 5% to 15%. In the rapid heating process/rapid cooling process, the gas partial pressure of each kind of gas in the gas mixture preferably may be a constant value; however, if required, it may be varied with time, temperature or temperature gradient.

In the invention, the number and order of the rapid heating/cooling process, processing duration, initial temperature, predetermined temperature to achieve and temperature gradient in the step S120 are not limited, but an example is given here in the present embodiment. In the step S120, for example, the wafer may be heated first in a rapid heating process and then cooled in a rapid cooling process, and additional unlimited number of rapid heating process and/or rapid cooling process may be performed alternately later. Specifically, the wafer may be heated from an initial temperature which falls within 1000° C. to 1200° C. with a temperature gradient which falls within 600° C./sec to 800° C./sec to a predetermined high temperature which falls within 1200° C. to 1400° C., and then cooled with a temperature gradient which falls within 50° C./sec to 150° C./sec to a predetermined low temperature which falls within 400° C. to 600° C. In other embodiment, if required, the wafer may be held at the predetermined high temperature or at the predetermined low temperature for a while. For example, the wafer may be heated in the rapid heating process to the predetermined high temperature, held at the predetermined high temperature for a while, and then cooled in the rapid cooling process to the predetermined low temperature.

Rapid thermal process may provide energy to allow atoms in disorder at the surface of the wafer moving to a place with lowest static energy to eliminate vacancies and self-interstitialcies, and form a layer of near-perfect monocrystalline. Through this process, grown-in defects may be reduced, and agglomerated intrinsic point defect may be hindered. The layer of near-perfect monocrystalline here is called a denuded zone (DZ), which depth preferably falls within 3 μm to 30 μm. The denuded zone may be served for forming a plurality of semiconductor devices. Because of scarce defects in the denuded zone, such wafer has potential for forming semiconductor devices with great characteristics. Here, the ratio of each kind of gas in the gas mixture may be adjusted for forming the denuded zone with high quality.

Rapid thermal process may facilitate the generation of a deuterium solid solution and/or a nitrogen solid solution in the wafer from a part of deuterium gas and/or nitrogen gas. Preferably, a concentration of a nitrogen solid solution in the wafer may fall within $1 \times 10^{12}$ atom/cm$^3$ to $8 \times 10^{18}$ atom/cm$^3$, and a concentration of a deuterium solid solution in the wafer may fall within $1 \times 10^{12}$ atom/cm$^3$ to $8 \times 10^{18}$ atom/cm$^3$. A part of deuterium gas in the gas mixture may be interstitial impurities between the silicon atoms. These interstitial deuterium atoms bring great potential to the wafer, which may be not shown until a later process or the operation of the semiconductor devices. For example, when the wafer is served as a substrate to from the semiconductor devices thereon, the interstitial deuterium atoms may be released to bind to the dangling bonds at the interfaces to form a stable covalent bond, and this may promote the performance of the semiconductor device. Specifically, the interstitial deuterium atoms may be released to bind to the dangling bonds at the interface between a gate oxide layer and silicon or a dielectric layer when forming the gate oxide layer or dielectric layer. Therefore, depassivation may be smoothed to ensure the performance of the semiconductor devices, strengthen the resistance of the semiconductor against the hot carriers, reduce the leakage current, and raise the reliability of semiconductor devices Because of the higher concentration of the solid solution in the wafer in a high temperature, compared with that in a low temperature, the high concentration of residual vacancies on the backside surface of the wafer, and the oxygen gas in the gas mixture, oxygen precipitations are formed in the wafer in the rapid thermal process to form a plurality of bulk micro-defects in a bulk zone which is under the denuded zone. Preferably, these bulk micro-defects are formed under the denuded zone, which is at a depth of 3 μm to 30 μm from a surface of the wafer, and beyond the active region of the semiconductor devices. If the gas mixture comprises nitrogen air, the oxygen precipitations may be formed with a higher density to promote the mechanical strength of the wafer and to restrain vacancies. These bulk micro-defects as neighbors to the active region bring great effects to the semiconductor devices, such as providing a resource of intrinsic gettering for trapping metal impurities to avoid adverse effects of the metal impurities on the semiconductor devices, etc. The temperature gradient in the rapid heating/cooling process may be controlled to promote the density of the bulk micro-defects, tailor the size of the bulk micro-defects; therefore, the dislocations caused by the shearing stress generated in the fabrication process may be avoided from slipping to promote the mechanical strength of the semiconductor devices.

Therefore, as mentioned above, wafers processed by the thermal processing method according to the present invention, preferably, have less point defects but have a denuded zone on a surface, and get deuterium atoms which may be released to improve characteristics at an interface of the semiconductor devices in a later process, control the position of the bulk micro-defects away from the semiconductor devices, improve resistance against hot carriers, reduce leakage current, smooth depassivation, and improve performance and reliability of the semiconductor devices.

While various embodiments in accordance with the disclosed principles have been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A thermal processing method for wafer, comprising: placing at least one wafer in an environment filled with a gas mixture comprising oxygen gas and deuterium gas, and performing a rapid thermal process on a surface of the least one wafer, wherein the rapid thermal process forms a deuterium solid solution in the at least one wafer, and wherein a concentration of a deuterium solid solution in the at least one wafer falls within $1 \times 10^{12}$ atom/cm$^3$ to $8 \times 10^{18}$ atom/cm$^3$.

2. The thermal processing method for wafer as claim 1, wherein the gas mixture further comprises argon gas and nitrogen gas.

3. The thermal processing method for wafer as claim 2, wherein the gas partial pressure of the argon gas in the gas mixture falls within 1% to 99%.

4. The thermal processing method for wafer as claim 2, wherein the gas partial pressure of the nitrogen gas in the gas mixture falls within 1% to 99%.

5. The thermal processing method for wafer as claim 1, wherein the gas partial pressure of the oxygen gas in the gas mixture falls within 1% to 99%.

6. The thermal processing method for wafer as claim 1, wherein the gas partial pressure of the deuterium gas in the gas mixture falls within 1% to 99%.

7. The thermal processing method for wafer as claim 1, wherein the rapid thermal process comprises a rapid heating process and a rapid cooling process.

8. The thermal processing method for wafer as claim 7, wherein in the rapid thermal process, the least one wafer was cooled from a predetermined high temperature which falls within 1200° C. to 1400° C. with a temperature gradient which falls within 50° C./sec to 150° C./sec.

9. The thermal processing method for wafer as claim 1, wherein a concentration of a nitrogen solid solution in the at least one wafer falls within $1 \times 10^{12}$ atom/cm$^3$ to $8 \times 10^{18}$ atom/cm$^3$.

10. The thermal processing method for wafer as claim 1, wherein a denuded zone is formed at a depth of 3 μm to 30 μm from a surface of the at least one wafer, and a plurality of bulk micro-defects are formed in a bulk zone which is under the denuded zone.

11. The thermal processing method for wafer as claim 1, wherein the step of placing at least one wafer in an environment filled with a gas mixture comprising oxygen gas and deuterium gas, and performing a rapid thermal process on a surface of the least one wafer was performed after forming the at least one wafer by slicing an ingot and before fabricating a structure of a plurality of semiconductor devices on the at least one wafer.

* * * * *